United States Patent
Lee et al.

(10) Patent No.: US 12,020,771 B2
(45) Date of Patent: Jun. 25, 2024

(54) DIE LOCATION DETECTION FOR GROUPED MEMORY DIES

(71) Applicant: Micron Technology, Inc., Boise, ID (US)

(72) Inventors: Hyunyoo Lee, Boise, ID (US); Kang-Yong Kim, Boise, ID (US); Yang Lu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 136 days.

(21) Appl. No.: 17/818,413

(22) Filed: Aug. 9, 2022

(65) Prior Publication Data

US 2023/0052489 A1    Feb. 16, 2023

Related U.S. Application Data

(60) Provisional application No. 63/232,973, filed on Aug. 13, 2021.

(51) Int. Cl.
*G11C 7/10* (2006.01)
*H03K 19/017* (2006.01)
*H03K 19/173* (2006.01)

(52) U.S. Cl.
CPC .......... *G11C 7/109* (2013.01); *G11C 7/1087* (2013.01); *H03K 19/01742* (2013.01); *H03K 19/1737* (2013.01)

(58) Field of Classification Search
CPC ......... G11C 7/109; G11C 7/1087; G11C 7/20; G11C 8/12; G11C 11/4093; G11C 5/04; G11C 7/1003; G11C 11/4072; H03K 19/01742; H03K 19/1737
USPC ....................... 365/189.05, 230.06
See application file for complete search history.

(56) References Cited

U.S. PATENT DOCUMENTS

| | | | | |
|---|---|---|---|---|
| 2007/0165461 A1* | 7/2007 | Cornwell | ............... | G11C 29/88 365/185.33 |
| 2008/0013380 A1* | 1/2008 | Cornwell | ........... | G11C 16/3431 365/185.21 |
| 2009/0052267 A1* | 2/2009 | Kao | ........................ | G11C 5/066 365/230.01 |
| 2011/0194326 A1* | 8/2011 | Nakanishi | ................ | G11C 5/02 365/51 |
| 2013/0229848 A1* | 9/2013 | Vogelsang | ............. | G11C 5/063 365/63 |

(Continued)

OTHER PUBLICATIONS

"International Search Report and Written Opinion of the International Searching Authority," issued in connection with Int'l Appl. No. PCT/US2022/074748, dated Dec. 2, 2022 (10 pages).

*Primary Examiner* — Michael T Tran

(74) *Attorney, Agent, or Firm* — Holland & Hart LLP

(57) ABSTRACT

Methods, systems, and devices for die location detection for grouped memory dies are described. A memory device may include multiple memory die that are coupled with a shared bus. In some examples, each memory die may include a circuit configured to output an identifier associated with a location of the respective memory die. For example, a first memory die may output a first identifier, based on receiving one or more signals, that identifies a location of the first memory die. Identifying the locations of the respective memory dies may allow for the dies to be individually accessed despite being coupled with a shared bus.

35 Claims, 6 Drawing Sheets

(56) References Cited

U.S. PATENT DOCUMENTS

| | | | |
|---|---|---|---|
| 2014/0241022 A1 | 8/2014 | Nakanishi et al. | |
| 2015/0009743 A1* | 1/2015 | Chung | G11C 29/78 365/96 |
| 2015/0248921 A1* | 9/2015 | Chen | G11C 5/04 711/103 |
| 2016/0299724 A1* | 10/2016 | Vanaraj | G06F 3/0616 |
| 2017/0031656 A1* | 2/2017 | Mukhopadhyay | G06F 7/588 |
| 2017/0168716 A1 | 6/2017 | Shaharabany et al. | |
| 2019/0163620 A1* | 5/2019 | Muthiah | G06F 9/3013 |
| 2021/0191625 A1 | 6/2021 | Park | |
| 2021/0224195 A1 | 7/2021 | O | |
| 2021/0240615 A1* | 8/2021 | Sohn | G06F 12/0284 |
| 2021/0248065 A1 | 8/2021 | Kanno | |
| 2021/0311638 A1* | 10/2021 | Smith | G06F 3/0614 |
| 2022/0083237 A1* | 3/2022 | Na | G06F 3/0688 |
| 2022/0164301 A1* | 5/2022 | Basu | G11C 7/1063 |
| 2023/0038894 A1* | 2/2023 | Lu | G11C 29/26 |
| 2023/0046535 A1* | 2/2023 | Cariello | G06F 3/0658 |
| 2023/0119361 A1* | 4/2023 | Chritz | H04L 9/3268 713/171 |
| 2023/0395108 A1* | 12/2023 | Bhatia | G11C 7/222 |

\* cited by examiner

DIE LOCATION DETECTION FOR GROUPED MEMORY DIES

CROSS REFERENCE

The present application for patent claims the benefit of U.S. Provisional Patent Application No. 63/232,973 by LEE et al., entitled "DIE LOCATION DETECTION FOR GROUPED MEMORY DIES," filed Aug. 13, 2021, assigned to the assignee hereof, and expressly incorporated by reference herein.

FIELD OF TECHNOLOGY

The following relates generally to one or more systems for memory and more specifically to die location detection for grouped memory dies.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

A memory device may include a set of multiple memory dies that may be grouped together for command and control operations and data access operations. Each memory die in a group may be coupled with a same command/address (CA) channel (sometimes referred to as a CA bus) and may each be operable by a same command transmitted via the CA channel. For example, if the CA channel conveys a register write command, each of the memory dies of the group may respond by performing a register write operation (e.g., as indicated by the register write command). Some commands, however, may be specific to one memory die of the group, but each memory die of the group may perform the die-specific command, for example, because the memory dies share the CA channel.

In order to support access at a memory die of the group, or a subset of memory dies of the group, the present disclosure provides techniques for identifying a location of a particular memory die (or multiple memory dies) of the group. For example, each memory die of the group may include a circuit (e.g., a location detection circuit as described herein) configured to output an identifier associated with its location. In some instances, a memory die may output a respective identifier based on its circuit receiving one or more signals. Upon outputting the identifier, it may be stored to a non-volatile read-only memory associated with the memory die such that, during a subsequent operation (e.g., an access operation), the identifier may be used to identify the location of the memory die. That is, storing the location of a memory die to non-volatile read-only memory may allow for a die-specific commands to be performed. Thus, each memory die of the group may be individually accessed despite being coupled with the shared CA channel, which may improve the overall efficiency of the memory system.

Features of the disclosure are initially described in the context of systems and dies as described with reference to FIGS. 1 and 2. Features of the disclosure are described in the context of a memory die configuration and a circuit diagram as described with reference to FIGS. 3 and 4. These and other features of the disclosure are further illustrated by and described with reference to an apparatus diagram and a flowchart that relate to die location detection for grouped memory dies as described with reference to FIGS. 5 and 6.

Figure 1:
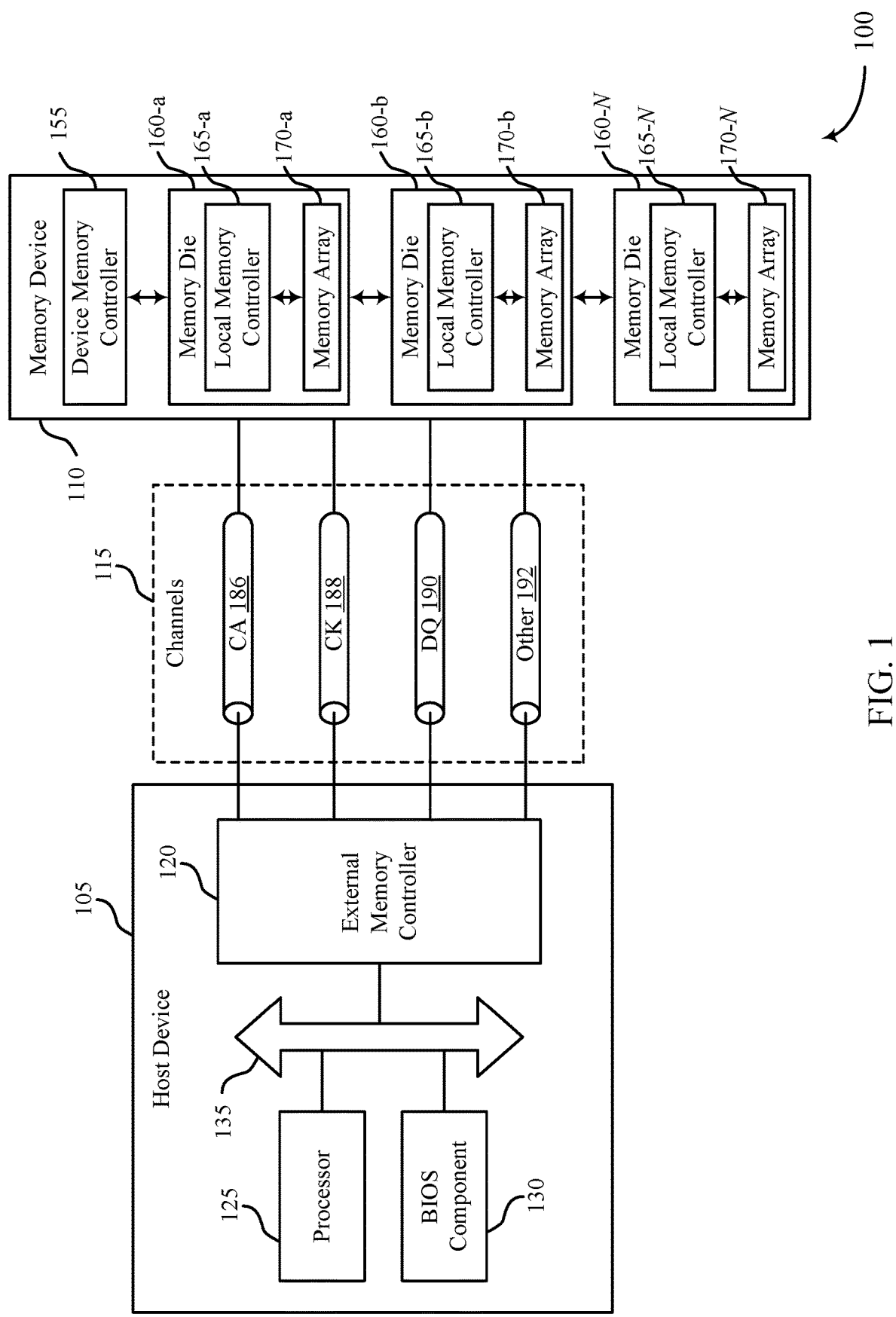
FIG. 1 illustrates an example of a system that supports die location detection for grouped memory dies in accordance with examples as disclosed herein.

FIG. 1 illustrates an example of a system 100 that supports die location detection for grouped memory dies in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more CA channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths). As described herein, a CA channel 186 may be coupled with more than one memory array 170. In some instances, they memory arrays 170 may be individually accessible despite being coupled with the shared CA channel, which may improve the overall efficiency of the memory device 110.

The memory device 110 may be am example of a CXL device, and the memory device memory controller 155 may be an example of a processing unit that is configured to access the memory dies 160, or one or more memory arrays 170 of the memory dies 160. For example, the memory die 160-*a* may include a plurality of memory arrays 170 that are coupled with a shared channel (e.g., the CA channel 186). During manufacturing of the memory dies 160, each individual memory die 160 may not be assigned a location. That is, the memory die 160-*a* (or the memory array 170-*a* of the memory die 160-*a*) may not be individually accessible. Thus, commands transmitted via the CA channel 186 may be received by each of the memory dies 160 coupled with the bus, which may increase the processing overhead of the memory device 110.

As described herein, each memory die 160 may include a circuit (e.g., a location detection circuit as described herein) configured to output an identifier associated with its location. In some instances, a memory die 160 may output a respective identifier based on its circuit receiving one or more signals. Moreover, the identifier may be stored to a non-volatile read-only memory associated with the memory die 160 such that, during a subsequent operation (e.g., an access operation), the identifier may be used to identify the location of the memory die 160. That is, storing the location of a memory die 160 to non-volatile read-only memory may allow the device memory controller 155 to access a particular memory die 160 based on its location. Accordingly, each memory die 160 may be individually accessed despite being coupled with the shared CA channel 186, which may improve the overall efficiency of the memory device 110.

Figure 2:
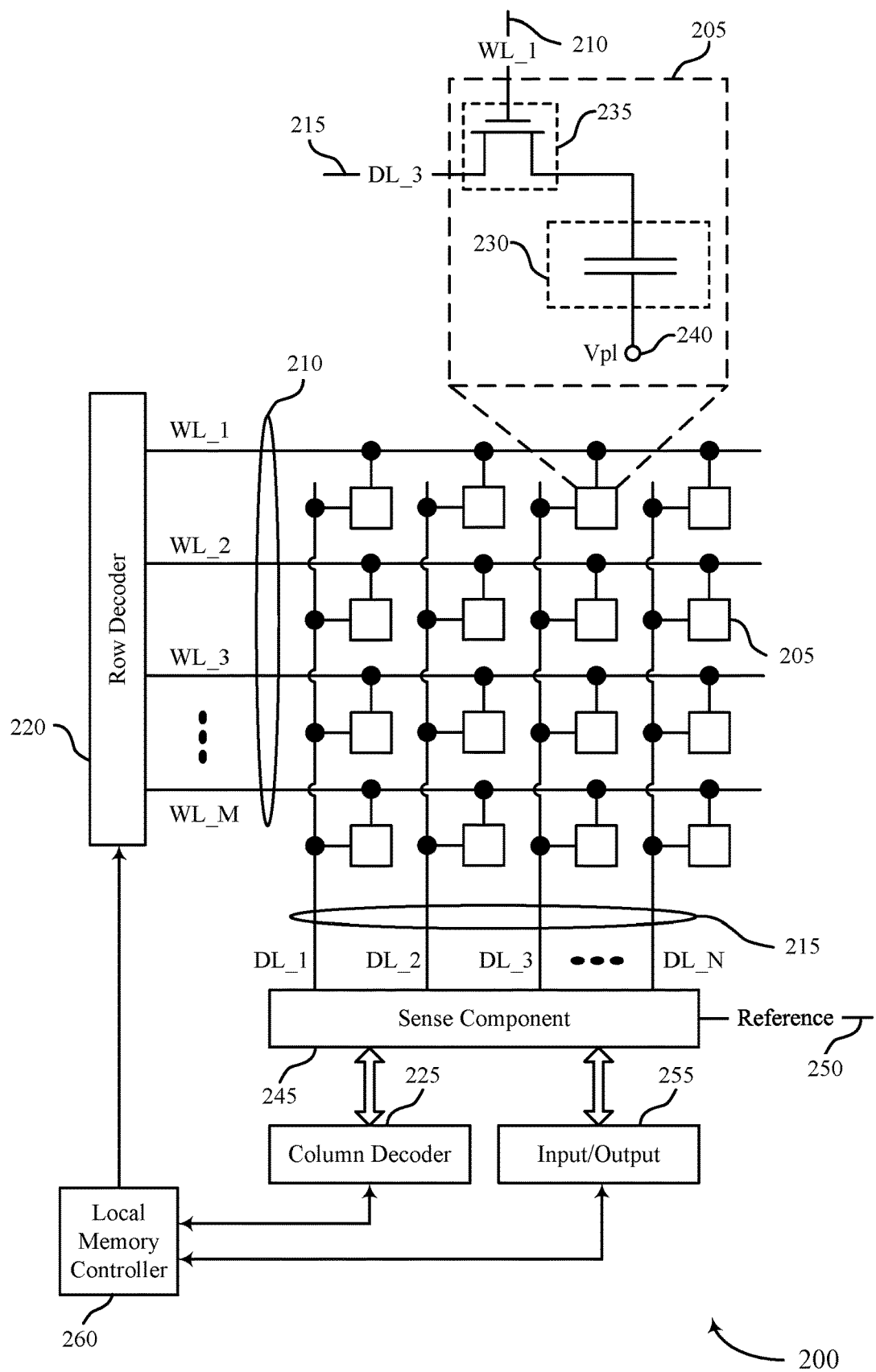
FIG. 2 illustrates an example of a memory die that supports die location detection for grouped memory dies in accordance with examples as disclosed herein.

FIG. 2 illustrates an example of a memory die 200 that supports die location detection for grouped memory dies in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The memory die 200 may be an example of a CXL device (or a portion of a CXL device), and the local memory controller 260 may be an example of a processing unit that is configured to access the memory die 200. For example, the memory die 200 may be located in a memory system having a plurality of memory dies (e.g., memory dies 160 as described with reference to FIG. 1) that are coupled with the CA channel (e.g., a CA channel 186 as described with reference to FIG. 1). In some instances, the CA channel may be an example of a channel that is coupled (e.g., shared between) multiple memory die 200. During manufacturing of a memory system including the memory die 200, the memory die 200 not be assigned a location. That is, the memory die 200 may not be individually accessible. Thus, commands transmitted via the CA channel may be received by each of the memory dies coupled with the CA channel (e.g., including the memory die 200), which may increase the processing overhead of the associated memory system.

As described herein, the memory die 200 may include a circuit (e.g., a location detection circuit as described herein) configured to output an identifier associated with its location. In some instances, the memory die 200 may output a respective identifier based on its circuit receiving one or more signals. Moreover, the identifier may be stored to a non-volatile read-only memory associated with the memory die 200 such that, during a subsequent operation (e.g., an access operation), the identifier may be used to identify the location of the memory die 200. That is, storing the location of a memory die to non-volatile read-only memory may allow the local memory controller 260 to access the memory die 200 based on its location. Accordingly, the memory die 200 (and other memory die included in a same memory system) may be individually accessed despite being coupled with the shared CA channel, which may improve the overall efficiency of the associated memory system.

Figure 3:
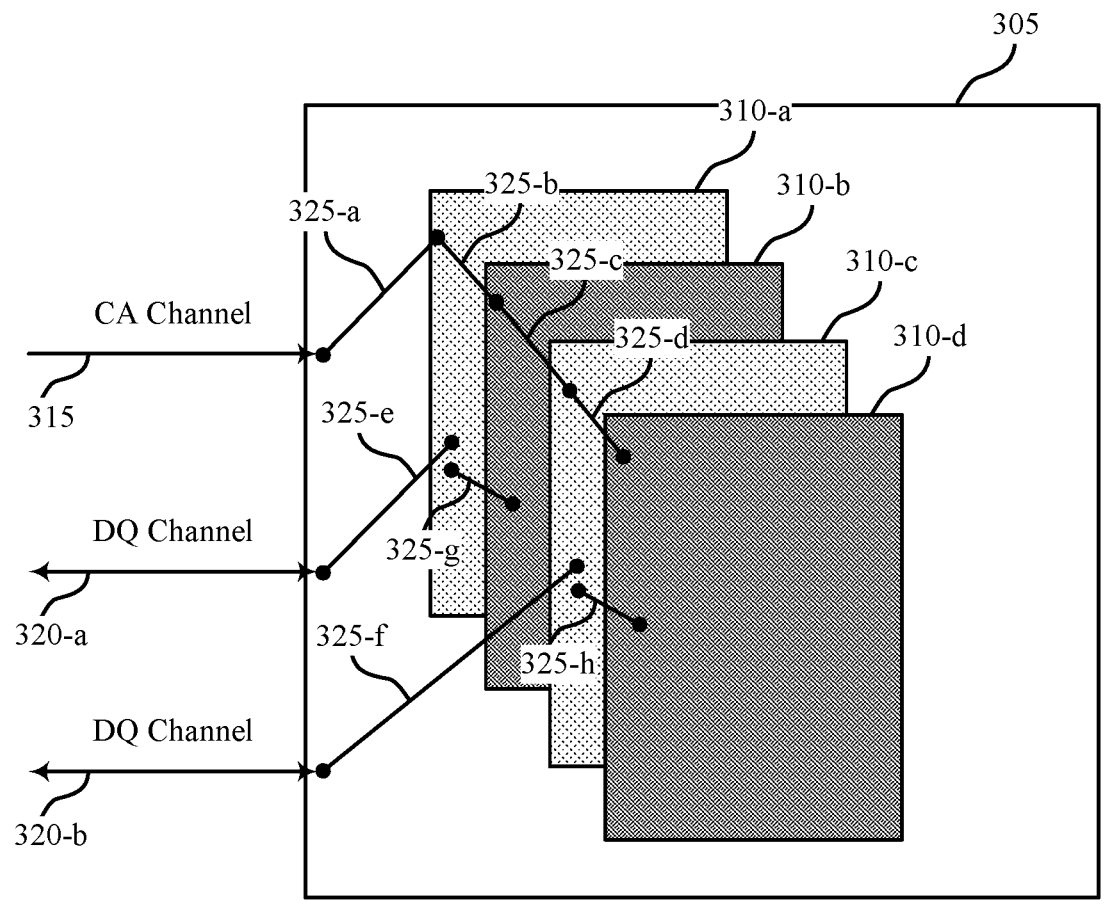
FIG. 3 illustrates an example of a memory die configuration that supports die location detection for grouped memory dies in accordance with examples as disclosed herein.

FIG. 3 illustrates an example of a memory die configuration 300 that supports die location detection for grouped memory dies in accordance with examples as disclosed herein. Memory die configuration 300 may represent a part or a portion of a memory system described herein with reference to FIGS. 1 and 2. For example, the memory die configuration 300 may include a group 305 of memory dies 310, where each of the memory dies 310 may represent a respective memory die (e.g., a memory die 160) as described with reference to FIGS. 1 and 2. The group 305 of memory dies 310 may include a quantity of memory dies 310 (e.g., four memory dies 310) that may share a same CA channel 315 (e.g., may each be coupled with the same CA channel 315). The CA channel 315 may represent a CA channel, a CK channel, or both, as described with reference to FIG. 1. Additionally, or alternatively, the CA channel 315 may represent a chip select (CS) channel, which may be used to select one or more memory chips of the memory device (e.g., in addition to being used as a CA channel, a CK channel, or both).

As illustrated by FIG. 3, each memory die 310 may be coupled with the CA channel 315, such as via one or more electrical connections, traces, or electrodes (e.g., among other examples). In some cases, each memory die 310 may be coupled directly with the CA channel 315, while in some other cases each memory die 310 may be coupled with the CA channel 315 via another memory die 310. As described herein, memory dies 310 that are coupled with the CA channel 315 through a direct connection 325 (e.g., a trace or electrode) may be referred to as interface dies 310 (or an interface die 310), whereas memory dies 310 that are indirectly coupled with a CA channel 315 may be referred to as linked dies 310 (or a linked die 310). For example, a memory die 310-a may be coupled with the CA channel 315 through a connection 325-a (e.g., a trace or electrode) and thus may be referred to as an interface die 310-a, whereas a memory die 310-b may be coupled with the memory die 310-a via a connection 325-g and thus may be referred to as a linked die 310-b. Each of memory dies 310-a through 310-d may be an interface die 310 or a linked die 310 depending on how the respective die is coupled with the CA channel 315.

Each memory die 310 may be coupled with a respective DQ channel 320. A first set of memory dies 310 (e.g., memory die 310-a and memory die 310-b) may share a first DQ channel (e.g., may both be coupled with a DQ channel 320-a) and a second set of memory dies 310 (e.g., memory die 310-c and memory die 310-d) may share a second DQ channel (e.g., may both be coupled with a DQ channel 320-b). Each memory die 310 may be coupled with the respective DQ channel 320 via one or more electrical connections, traces, or electrodes (e.g., among other examples). In some cases, each memory die 310 may be coupled directly with the respective DQ channel 320, while in some other cases each memory die 310 may be coupled with the respective DQ channel 320 via another memory die 310.

For example, memory die 310-a may be coupled with DQ channel 320-a through a connection 325-e and memory die 310-b may be coupled with DQ channel 320-a through a connection 325-g and connection 325-e. Similarly, memory die 310-c may be coupled with DQ channel 320-b through a connection 325-f and memory die 310-d may be coupled with DQ channel 320-b through a connection 325-h and connection 325-f.

The grouped memory dies 310 may be referred to as being one group 305 per rank per channel, for example, based on each memory die 310 in the group 305 being coupled with (e.g., and operable by) the same CA channel 315 (e.g., CA channel, CK channel, CS channel, or any combination). Because the memory dies 310 share a same CA channel 315, the memory dies 310 may receive a same command (e.g., at the same time) via the CA channel 315 and may all be operable the received command.

In some cases, the memory die configuration 300 may be a part of, or represent an example of, a CXL configuration for the memory device. For example, an interface for the group 305 of memory dies, for example, as represented by the CA channel 315 and the DQ channels 320-a and 320-b, may be an interface that is configured for CXL protocols. While some examples described herein are with reference to memory dies 310 configured according to one or more CXL protocols, the same examples may apply to any configuration of memory dies 310 that are coupled with a same CA channel 315.

As described herein, the memory dies 310 may be independently accessible (e.g., by a host device 105 as described with reference to FIG. 1) despite being coupled with the same CA channel 315. In some instances, during manufacturing of the group 305, the associated memory dies 310 may not be assigned a location. For example, memory dies may be manufactured in bulk and may assembled in a memory system in any order. Thus, a location of any given memory die (relative to other memory dies) in a memory system may not be known until after assembly of the system. Thus, to support individual access at a memory die 310 (e.g., or a subset of memory dies 310 of the group 305), the present disclosure provides techniques for identifying and outputting, from one or more memory dies 310, an identifier associated with the location of the respective memory die 310. Accordingly, commands transmitted via the CA channel 315 may be received by each of the memory dies 310 coupled with the CA channel 315, which may increase the processing overhead of the associated memory device.

Each memory die 310 may include a circuit (e.g., a location detection circuit as described herein) configured to output an identifier associated with its location. In some instances, a memory die 310 may output a respective identifier based on its circuit receiving one or more signals. Moreover, the identifier may be stored to a non-volatile read-only memory associated with the memory die 310 such that, during a subsequent operation (e.g., an access operation), the identifier may be used to identify the location of the memory die 310. That is, storing the location of a memory die 310 to non-volatile read-only memory may allow a memory die 310 to be individually accessed based on its location. Accordingly, each memory die 310 may be individually accessed despite being coupled with the CA channel 315, which may improve the overall efficiency of the associated memory device or memory system.

Figure 4:
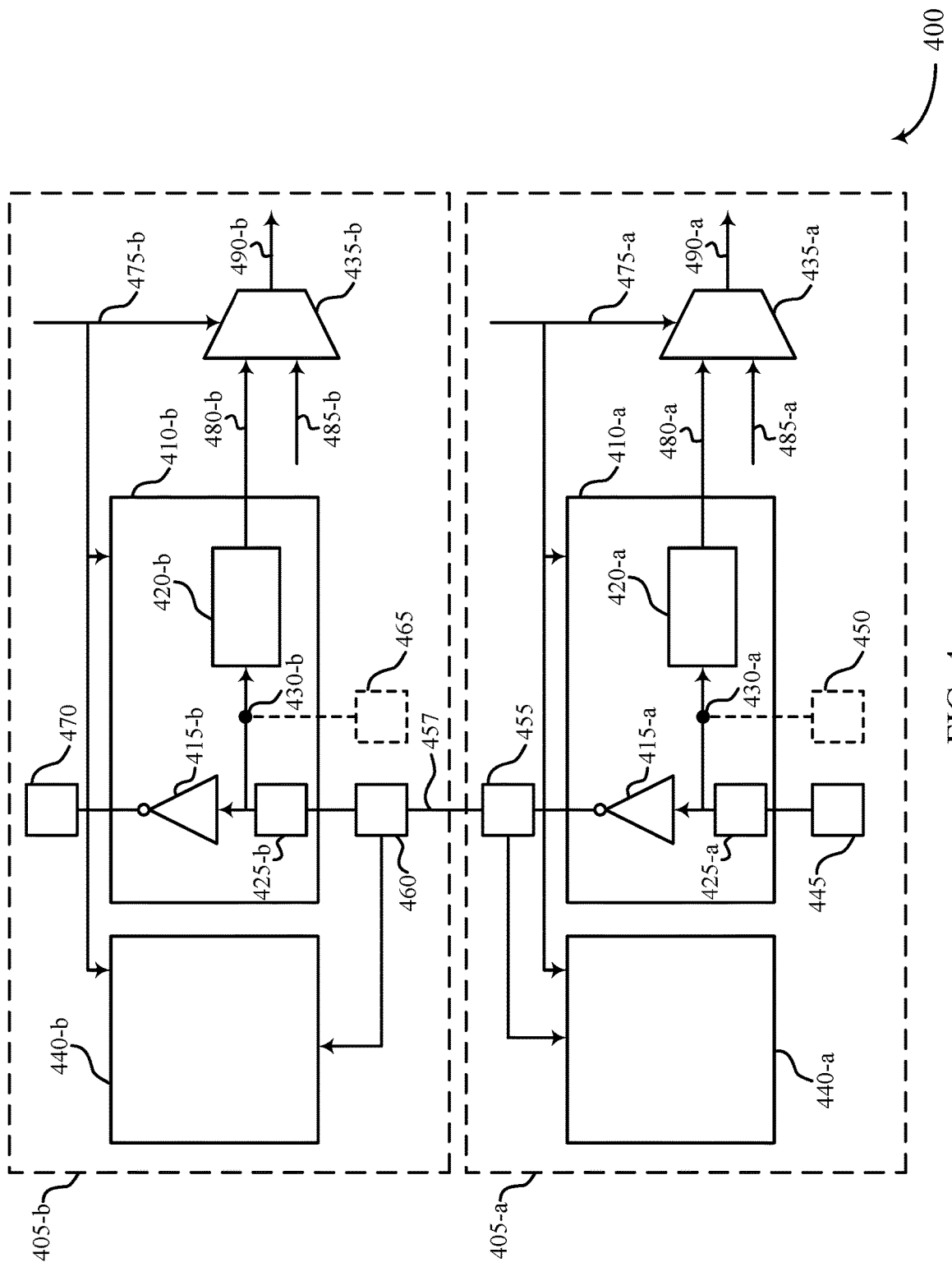
FIG. 4 illustrates an example of a circuit diagram that supports die location detection for grouped memory dies in accordance with examples as disclosed herein.

FIG. 4 illustrates an example of a circuit diagram 400 that supports die location detection for grouped memory dies in accordance with examples as disclosed herein. The circuit diagram 400 may illustrate a first memory die 405-a and a second memory die 405-b that are coupled with a host system (e.g., a host device 105 as described with reference to FIG. 1) via a CA channel (not shown). In some examples, the CA channel may be coupled with multiple memory dies 405 and each memory die 405 may be individually accessible by the host system. For example, the first memory die 405-a and the second memory die 405-b may each include a respective circuit 410 (e.g., a respective location detection circuit 410) that may be operable to identify a location of the respective memory die 405 after assembly. By accessing one or more memory dies 405 individually, the overall efficiency of the associated memory system may be improved.

The circuit diagram 400 may illustrate a first memory die 405-a and a second memory die 405-b. Each of the memory dies 405 may include a circuit 410 (e.g., a location detection circuit 410) that is operable to identify a location of the respective memory die 405 relative to other memory dies in the system. The location of the memory die may be used to indicate which memory die is to enter a single die access mode. The first memory die 405-*a* may include a first location detection circuit 410-*a* that is operable to identify a location of the first memory die 405-*a* such that the first memory die 405-*a* is individually accessible by a host system (e.g., the host system can transmit a command directly to the first memory die using the shared CA channel). Similarly, the second memory die 405-*b* may include a second location detection circuit 410-*b* that is operable to identify a location of the second memory die 405-*b* such that the second memory die 405-*b* is individually accessible by a host system (e.g., the host system can transmit a command directly to the first memory die using the shared CA channel).

Each location detection circuit 410 may include an inverter 415, a latch 420, a pull-down circuit 425, and a node 430. The inverters 415 may be configured to invert a value of a signal received by the respective location detection circuit 410. In some instances, the inverters 415 may be configured to invert a value of a signal received from a respective pull-down circuit 425. The pull-down circuits 425, which may be or may be referred to as weak pull-down circuits 425, may adjust (e.g., adjust downward) a value of a signal received by the respective location detection circuit 410. In some instances, the pull-down circuits 425 may include one or more resistors (e.g., in parallel or in series) that adjust the value of the received signal.

Additionally, or alternatively, the latches 420 may be coupled with respective nodes 430 and may be configured to latch a value of a received signal and output the signal to a respective multiplexer 435. For example, the latch 420-*a* may receive a signal based on a voltage of a first node 430-*a*, and the voltage of the first node 430-*a* may be based on a signal received from the pull-down circuit 425-*a* or from another source. Similarly, the latch 420-*b* may receive a signal based on a voltage of a second node 430-*b*, and the voltage of the second node 430-*b* may be based on a signal received from the pull-down circuit 425-*b* or from another source. Each latch 420 store the respective received signal (e.g., a value associated with the respective received signal) and may output the received signal (e.g., an identifier associated with the respective memory die 405) to a respective multiplexer 435. As described herein, the respective multiplexers 435 may output a signal indicating a location of the respective memory die 405.

Each memory die 405 may include at least one multiplexer 435. For example, the first memory die 405-*a* may include a multiplexer 435-*a* (e.g., a first multiplexer 435-*a*) coupled with a first input 480-*a*, a second input 485-*a*, and a control signal 475-*a* (e.g., a first signal). Similarly, the second memory die 405-*b* may include a multiplexer 435-*b* (e.g., a second multiplexer 435-*b*) coupled with a first input 480-*b*, a second input 485-*b*, and a control signal 475-*b*. In some instances, the control signal 475-*a* and the control signal 475-*b* may be a same control signal that is activated to initiate a location detection operation for the memory dies 405 (e.g., the control signal 475 may activate the respective location detection circuits 410 and also result in the respective multiplexers 435 outputting the first input 480).

In some examples, the multiplexers 435 may be coupled with a first input 480 that is associated with an output from the respective latches 420. That is, each latch 420 may output a respective identifier that may be received at a first input 480 of the respective multiplexer 435. During a location detection operation for the memory dies 405, each multiplexer 435 may receive the control signal 475, which may result in the multiplexers 435 outputting the first input 480 (e.g., via output 490). For example, the latch 420-*a* may output an identifier of the first memory die 405-*a* (e.g., an identifier indicating the location of the first memory die 405-*a*). Based on the multiplexer 435-*a* receiving the control signal 475-*a*, the multiplexer 435-*a* may output the identifier of the first memory die 405-*a*.

In some instances, the output 490 of each multiplexer may be coupled with one or more registers (e.g., mode registers; not shown). Accordingly, in response to a multiplexer 435 outputting an identifier of a respective memory die 405, the identifier may be stored to the register (or respective registers) and may subsequently be stored to a non-volatile read-only memory associated with the respective memory die 405. For example, a portion of each memory die 405 may include non-volatile read-only memory, which may be or may include a bank of fuses or antifuses. Thus, storing an identifier of a respective memory die 405 may include applying a current to one or more fuses or antifuses to alter a state of the respective fuse or antifuse. In some instances, this operation may be referred to as "blowing a fuse" or "blowing an antifuse."

Accordingly, after a location detection operation is performed for the memory dies 405 (e.g., after one or more identifiers are stored in respective non-volatile read-only memory), the control signal 475 may no longer be applied to the multiplexers 435, which may result in the multiplexers 435 outputting the second input 485 (e.g., via output 490). For example, the multiplexer 435-*a* may output an identifier of the first memory die 405-*a* that is stored to its non-volatile read-only memory (e.g., the multiplexer 435-*a* may output a fzDieLoc[0] signal). Thus, during subsequent operations (e.g., access operations), the memory dies 405 may be configured to output their respective location information, which may allow the memory dies 405 to be individually accessible despite being coupled with a shared CA channel.

In some instances, the control signal 475 may also be associated with one or more other operations for the respective memory dies 405. For example, the control signal 475-*a* may be coupled with circuitry 440-*a* that is associated with or configured to perform other operations (e.g., access operations) on the first memory die 405-*a*. Accordingly, in response to the control signal 475-*a* being enabled, the first location detection circuit 410-*a* may be enabled and the circuitry 440-*a* may be disabled and vice versa. Similarly, the control signal 475-*b* may be coupled with circuitry 440-*b* that is associated with or configured to perform other operations (e.g., access operations) on the second memory die 405-*b*. Thus, in response to the control signal 475-*b* being enabled, the second location detection circuit 410-*b* may be enabled and the circuitry 440-*b* may be disabled and vice versa.

The location detection circuits 410 described herein may be configured to output an identifier based on receiving one or more signals. In some instances, the memory dies 405 may be coupled with one or more pins, pads, or voltage sources configured to initiate, receive, or relay the signals. Moreover, in some instances, the first memory die 405-*a* may be coupled to the second memory die 405-*b* via a bond wire 457.

In some examples, the first location detection circuit 410-*a* may be coupled with a pin 445. In some instances, the pin 445 may instead be a pad 445 that is coupled with a voltage source. The pin 445 may be configured to receive a signal (e.g., a second signal) having a first value. For example, the pin 445 may be configured to receive a signal having a negative voltage value (e.g., −1.0V). Additionally, or alternatively, the first location detection circuit 410-*a* may be coupled with a voltage source 450. In some instances, the voltage source 450 may be a negative or a ground voltage source that is coupled with the first node 430-*a*. Accordingly, a voltage of the first node 430-*a* may be at or below zero volts (0V) based on the voltage source 450.

The first memory die 405-*a* may also include a pin 455 that is coupled with a pin 460 of the second memory die 405-*b* via a bond wire 457. In some instances, the pins 455 and 460 may instead be pads (e.g., pads 455 and 460) that are coupled with the bond wire 457. The pin 455 may be configured to receive an inverted signal from the inverter 415-*a*. The signal may be inverted relative to the signal received by the pin 445 and may also have been pulled down by the pull-down circuit 425-*a*. For example, the pin 455 may be configured to receive a signal having a positive voltage value that is slightly lower than the signal received by the pin 445 (e.g., the signal may be approximately 0.8V).

Additionally, or alternatively, the second location detection circuit 410-*b* may be coupled with a voltage source 465. In some instances, the voltage source 465 may be a positive voltage source (e.g., Vcc) that is coupled with the second node 430-*b*. Accordingly, a voltage of the second node 430-*b* may be above zero volts (0V) based on the voltage source 465. The second location detection circuit 410-*b* may also include a pin 470 configured to receive an inverted signal from the inverter 415-*b*. The pin 470 may be coupled with other components of the second memory die 405-*b* or another memory die 405 (not shown).

Using the location detection circuits 410, various methods and configurations may be employed to identify locations of the memory dies 405. Each of the different methods and different configurations for location detection circuits 410 are described herein.

In a first implementation, an inverter, and a bond wire may be used to identify the location of memory dies. The control signal 475 (e.g., the tmfzLinkDetect signal) may be enabled, which may disable the circuitry 440 and enable the location detection circuits 410. Enabling the control signal 475 may also configure the multiplexers 435 to output a first input 480.

While the control signal 475 is enabled, the pin 445 may receive a second signal having a first value. For example, the second signal may have a value of −1.0V. In the first implementation, the location detection circuits 410 may not include respective pull-down circuits 425, thus the second signal may present at the first node 430-*a*, which is coupled with the latch 420-*a* and the inverter 415-*a*. The second signal at the first node 430-*a* may be sensed by the latch 420-*a*, and the latch 420-*a* may output a first identifier associated with the second signal (e.g., via the first input 480-*a*). In some examples, the first identifier may be associated with a logic "0", which may be used to identify the first memory die 405-*a*. As described herein, the multiplexer 435-*a* may output the first identifier (e.g., via output 490-*a*) to a register. The host device may then read the register and may cause the first identifier to be stored to a non-volatile read-only memory associated with the first memory die 405-*a*.

The portion of the signal transmitted to the inverter 415-*a* may be inverted, resulting in the signal having a second value (e.g., the signal may be inverted from −1.0V to 1.0V). The signal may be transmitted to the pin 455, which may be coupled with the pin 460 via the bond wire 457. Accordingly, the signal may be transmitted from the first memory die 405-*a* to the second memory die 405-*b*. At the second memory die 405-*b*, the signal may be present at the second node 430-*b*, which is coupled with the latch 420-*b*. In some instances, the signal received by the second node 430-*b* may be referred to as a third signal despite being a same signal as the second signal (or as an inverted version of the second signal).

The latch 420-*b* may output a second identifier associated with the signal (e.g., via the first input 480-*b*). In some examples, the second identifier may be associated with a logic "1", which may be used to identify the second memory die 405-*b*. As described herein, the multiplexer 435-*b* may output the first identifier (e.g., via output 490-*b*) to a register, and the first identifier may be stored to a non-volatile read-only memory associated with the first memory die 405-*a*. In some examples, the signal received by the second memory die 405-*b* may be inverted by the inverter 415-*b* and transmitted to a pin 470. As described herein, the pin 470 may be coupled with other components of the second memory die 405-*b* or another memory die 405 (not shown).

In some instances, after the identifiers are stored to a register or stored to respective non-volatile read-only memories, the control signal 475 may be disabled. Accordingly, the circuitry 440 may be enabled and other operations (e.g., an access operation) may be performed on the respective memory dies 405. During such operations, for example, the multiplexer 435-*a* of first memory die 405-*a* may receive the identifier stored to the non-volatile read-only memory (e.g., via the second input 485-*a*). Accordingly, the multiplexer 435-*a* may output a third identifier (e.g., via the output 490-*a*), which may be a same identifier as the first identifier and may be used to identify the first memory die 405-*a* for a respective access operation. In some instances, the first identifier may identify the first memory die 405-*a* as an interface die. The second memory die 405-*b* may perform similar operations and, in some instances, may output a fourth identifier which may identify the second memory die 405-*b* as a linked die.

In a second implementation, a pull-down circuit, an inverter, and a bond wire may be used to identify the location of memory dies. The control signal 475 (e.g., the tmfzLinkDetect signal) may be enabled, which may enable the location detection circuits 410. Enabling the control signal 475 may also configure the multiplexers 435 to output a first input 480.

While the control signal 475 is enabled, the pin 445 may receive a second signal having a first value (or may be floating). For example, the second signal may have a value of −1.0V. In the second implementation, the location detection circuits 410 may include respective pull-down circuits 425, thus the second signal may be pulled-down (e.g., if the node is floating) by the pull-down circuit 425-*a* at the first node 430-*a*, which is coupled with the latch 420-*a* and the inverter 415-*a*. The second signal at the first node 430-*a* may be sensed by the latch 420-*a*, and the latch 420-*a* may output a first identifier associated with the second signal (e.g., via the first input 480-*a*). In some examples, the first identifier may be associated with a logic "0", which may be used to identify the first memory die 405-*a*. As described herein, the multiplexer 435-*a* may output the first identifier (e.g., via the output 490-*a*) to a register. The host device may then read the register and may cause the first identifier to be stored to a non-volatile read-only memory associated with the first memory die 405-*a*.

The portion of the signal transmitted to the inverter 415-*a* may be inverted, resulting in the signal having a second value. The signal may be transmitted to the pin 455, which may be coupled with the pin 460 via the bond wire 457. Accordingly, the signal may be transmitted from the first memory die 405-*a* to the second memory die 405-*b*. At the second memory die 405-*b*, the signal at the second node 430-*b* may be pulled-down using the pull-down circuit 425-*b*. However, given that the signal is inverter, the pull-down circuit 425-*b* may be configured as a weak pull-down circuit that may not be capable of causing the signal to change its detected logic state. In some instances, the signal received by the second node 430-*b* may be referred to as a third signal despite being a same signal as the second signal (or as an inverted version of the second signal).

The latch 420-*b* may output a second identifier associated with the signal (e.g., via the first input 480-*b*). In some examples, the second identifier may be associated with a logic "1", which may be used to identify the second memory die 405-*b*. As described herein, the multiplexer 435-*b* may output the first identifier (e.g., via output 490-*b*) to a register, and the first identifier may be stored to a non-volatile read-only memory associated with the first memory die 405-*a*. In some examples, the signal received by the second memory die 405-*b* may be inverted by the inverter 415-*b* and transmitted to a pin 470. As described herein, the pin 470 may be coupled with other components of the second memory die 405-*b* or another memory die 405 (not shown).

In some instances, after the identifiers are stored to a register or stored to respective non-volatile read-only memories, the control signal 475 may be disabled. During a subsequent access operation, for example, the multiplexer 435-*a* of first memory die 405-*a* may receive the first identifier stored to the non-volatile read-only memory (e.g., via the second input 485-*a*). Accordingly, the multiplexer 435-*a* may output the first identifier (e.g., via the output 490-*a*), which may be used to identify the first memory die 405-*a* for a respective access operation. In some instances, the first identifier may identify the first memory die 405-*a* as an interface die. The second memory die 405-*b* may perform similar operations and, in some instances, may output a fourth identifier which may identify the second memory die 405-*b* as a linked die.

In a third implementation, a connection to one or more voltage sources may be used to identify the location of memory dies. The control signal 475 (e.g., the tmfzLink-Detect signal) may be enabled, which may enable the location detection circuits 410. Enabling the control signal 475 may also configure the multiplexers 435 to output a first input 480.

In the third implementation, the node second 430-*b* of the second memory die 405-*b* may be coupled with a voltage source 465 (e.g., Vcc) and the first node 430-*a* of the first memory die 405-*a* may be left floating. Each location device circuit (e.g., location detection circuits 410-*a* and 410-*b*) may include a pull-down circuit (e.g., pull-down circuits 425-*a* and 425-*b*) coupled with the first node 430-*a* and the second node 430-*b* and configured as weak-pull down circuits. The pull-down circuit 425-*a* may be configured to pull the first node 430-*a* down to a ground voltage. In contrast, the pull-down circuit 425-*b* (because it is a weak pull-down circuit) may not be configured to pull the second node 430-*b* to a voltage different than the voltage of the voltage source 465. In the third implementation, the location detection circuits 410-*a* and 410-*b* of the memory dies 405-*a* and 405-*b* may not be coupled via the bond wire 457. In some examples of the third implementation, the bond wire 457 may continue to be used for the circuitry 440-*a* and the circuitry 440-*b*. In some examples of the third implementation, the location detection circuits 410-*a* and 410-*b* may not include the inverters 415-*a* and 415-*b*.

In some examples, the pin 445 may receive a second signal having a first value. In some examples, the pin 445 may be left floating. In the third implementation, the location detection circuits 410 may include respective pull-down circuits 425, thus the second signal present at the first node 430-*a* may be pulled-down by the pull-down circuit 425-*a*. The second signal at the first node 430-*a* may be sensed or stored by the latch 420-*a*, and the latch 420-*a* may output a first identifier associated with the second signal (e.g., via the first input 480-*a*). In some examples, the first identifier may be associated with a logic "0", which may be used to identify the first memory die 405-*a*. As described herein, the multiplexer 435-*a* may output the first identifier (e.g., via the output 490-*a*) to a register, and the first identifier may be stored to a non-volatile read-only memory associated with the first memory die 405-*a*.

In the third implementation, the second node 430-*b* may be coupled with the voltage source 465 (e.g., Vcc). The voltage source 465 may be associated with a voltage value that is greater than a voltage of the node 430 (e.g., due to the signal being pulled down by the pull-down circuit 425-*b*). Accordingly, the voltage of the second node 430-*b* may be increased (e.g., to a voltage value at or near Vcc) based on the voltage source 465. The signal at the second node 430-*b* may be sensed or stored by the latch 420-*b*.

The latch 420-*b* may output a second identifier associated with the signal (e.g., via the first input 480-*b*). In some examples, the second identifier may be associated with a logic "1", which may be used to identify the second memory die 405-*b*. As described herein, the multiplexer 435-*b* may output the first identifier (e.g., via output 490-*b*) to a register, and the first identifier may be stored to a non-volatile read-only memory associated with the first memory die 405-*a*. In some examples, the signal received by the second memory die 405-*b* may be inverted by the inverter 415-*b* and transmitted to a pin 470. As described herein, the pin 470 may be coupled with other components of the second memory die 405-*b* or another memory die 405 (not shown).

In some instances, after the identifiers are stored to a register or stored to respective non-volatile read-only memories, the control signal 475 may be disabled. During a subsequent access operation, for example, the multiplexer 435-*a* of first memory die 405-*a* may receive the identifier stored to the non-volatile read-only memory (e.g., via the second input 485-*a*). Accordingly, the multiplexer 435-*a* may output a third identifier (e.g., via the output 490-*a*), which may be a same identifier as the first identifier and may be used to identify the first memory die 405-*a* for a respective access operation. In some instances, the first identifier may identify the first memory die 405-*a* as an interface die. The second memory die 405-*b* may perform similar operations and, in some instances, may output a fourth identifier which may identify the second memory die 405-*b* as a linked die.

In a fourth implementation, a connection to one or more voltage sources may be used to identify the location of memory dies. The control signal 475 (e.g., the tmfzLink-Detect signal) may be enabled, which may enable the location detection circuits 410. Enabling the control signal 475 may also configure the multiplexers 435 to output a first input 480.

In the third implementation, the second node 430-*b* of the second memory die 405-*b* may be coupled with a voltage source 465 (e.g., Vcc) and the first node 430-*a* of the first memory die 405-*a* may be coupled with a voltage source 450

(e.g., a ground voltage, sometimes stated as GND). While the control signal 475 is enabled, the latch 420-*a* of the first location detection circuit 410-*a* may detect the signal at the first node 430-*a* (e.g., GND) and the latch 420-*b* of the second location detection circuit 410-*b* may detect the signal at the second node 430-*b* (e.g., Vcc). In some examples of the fourth implementation, the location detection circuits 410-*a* and 410-*b* of the memory dies 405-*a* and 405-*b* may not be coupled via the bond wire 457. In such implementations, the bond wire 457 may continue to be used for the circuitry 440-*a* and the circuitry 440-*b*. In some examples of the fourth implementation, the location detection circuits 410-*a* and 410-*b* may not include the inverters 415-*a* and 415-*b* or the pull-down circuits 425-*a* and 425-*b*.

The first node 430-*a* may be coupled with the voltage source 450 and may receive a second signal having a first value from the voltage source 450 (e.g., GND). For example, the second signal may have a value that is at or below 0V. The second signal may be transmitted from the first node 430-*a* to the latch 420-*a*, and the latch 420-*a* may output a first identifier associated with the second signal (e.g., via the first input 480-*a*). In some examples, the first identifier may be associated with a logic "0", which may be used to identify the first memory die 405-*a*. As described herein, the multiplexer 435-*a* may output the first identifier (e.g., via the output 490-*a*) to a register, and the first identifier may be stored to a non-volatile read-only memory associated with the first memory die 405-*a*.

The second node 430-*b* may be coupled with the voltage source 465 (e.g., Vcc) and may receive a signal (e.g., a third signal) from the voltage source 465. The latch 420-*b* may output a second identifier associated with the signal (e.g., via the first input 480-*b*). In some examples, the second identifier may be associated with a logic "1", which may be used to identify the second memory die 405-*b*. As described herein, the multiplexer 435-*b* may output the first identifier (e.g., via output 490-*b*) to a register, and the first identifier may be stored to a non-volatile read-only memory associated with the first memory die 405-*a*.

In some instances, after the identifiers are stored to a register or stored to respective non-volatile read-only memories, the control signal 475 may be disabled. During a subsequent access operation, for example, the multiplexer 435-*a* of first memory die 405-*a* may receive the identifier stored to the non-volatile read-only memory (e.g., via the second input 485-*a*). Accordingly, the multiplexer 435-*a* may output a third identifier (e.g., via the output 490-*a*), which may be a same identifier as the first identifier and may be used to identify the first memory die 405-*a* for a respective access operation. In some instances, the first identifier may identify the first memory die 405-*a* as an interface die. The second memory die 405-*b* may perform similar operations and, in some instances, may output a fourth identifier which may identify the second memory die 405-*b* as a linked die. Accordingly, by utilizing the circuits and methods described herein to detect a location of a respective memory die 405, the memory dies 405 may be individually accessible (e.g., by a host system) despite being coupled with and receiving the same commands via a shared CA channel.

Figure 5:
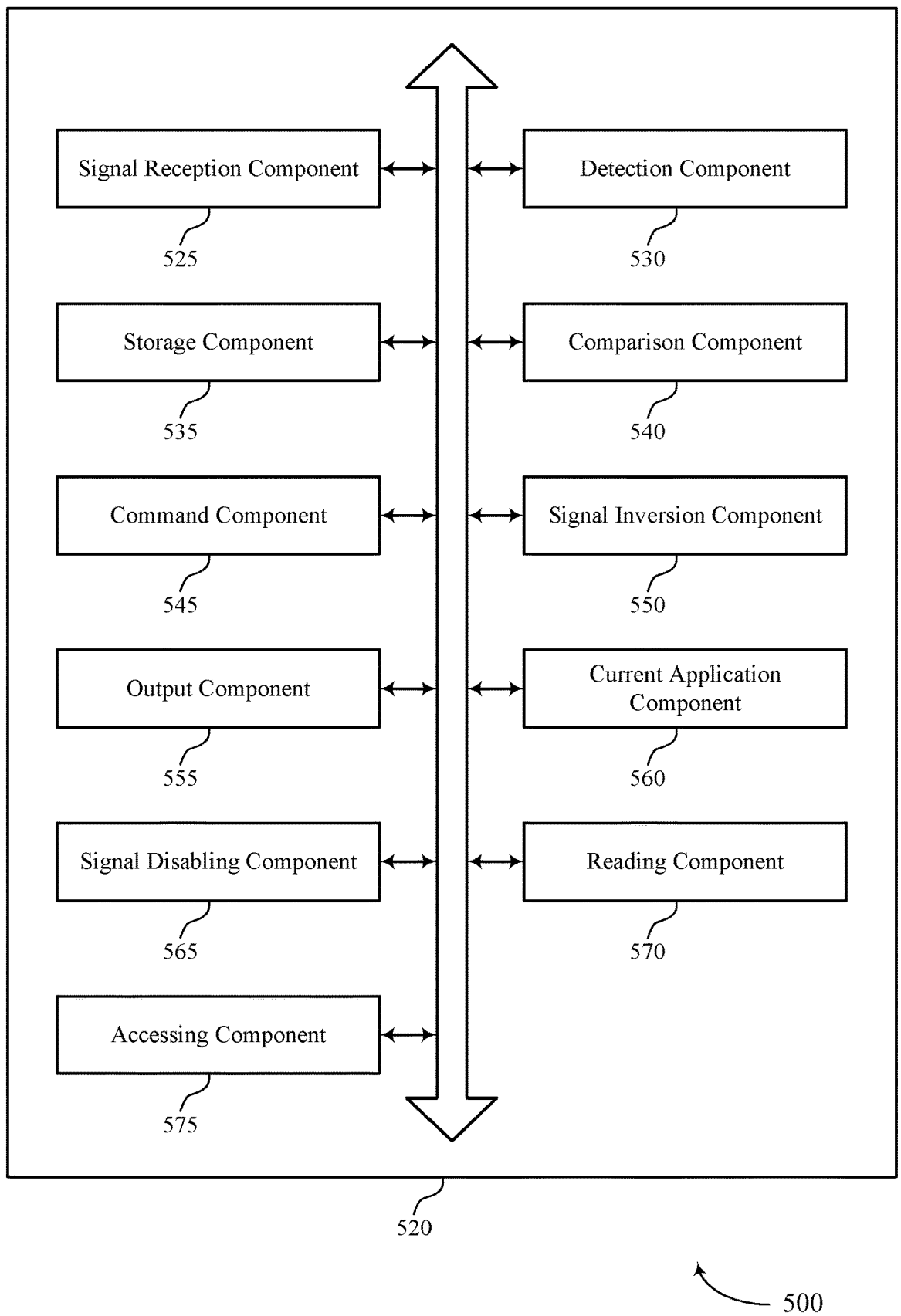
FIG. 5 shows a block diagram of a memory device that supports die location detection for grouped memory dies in accordance with examples as disclosed herein.

FIG. 5 shows a block diagram 500 of a memory device 520 that supports die location detection for grouped memory dies in accordance with examples as disclosed herein. The memory device 520 may be an example of aspects of a memory device as described with reference to FIGS. 1 through 4. The memory device 520, or various components thereof, may be an example of means for performing various aspects of die location detection for grouped memory dies as described herein. For example, the memory device 520 may include a signal reception component 525, a detection component 530, a storage component 535, a comparison component 540, a command component 545, a signal inversion component 550, an output component 555, a current application component 560, a signal disabling component 565, a reading component 570, an accessing component 575, or any combination thereof. Each of these components may communicate, directly or indirectly, with one another (e.g., via one or more buses).

The signal reception component 525 may be configured as or otherwise support a means for receiving, at a first memory die and a second memory die, a first signal enabling circuits of the first memory die and the second memory die. In some examples, the signal reception component 525 may be configured as or otherwise support a means for receiving, via a command/address channel coupled with the first memory die and the second memory die, an access command including one or more bits indicating to access the second memory die.

The detection component 530 may be configured as or otherwise support a means for detecting, by a first circuit of the first memory die, a first value of a second signal associated with a first location of the first memory die relative to the second memory die based at least in part on receiving the first signal. In some examples, the detection component 530 may be configured as or otherwise support a means for detecting, by a second circuit of the second memory die, a second value of a third signal associated with a second location of the second memory die relative to the first memory die based at least in part on receiving the first signal.

The storage component 535 may be configured as or otherwise support a means for storing, at a register associated with the first memory die, a first identifier of the first location of the first memory die based at least in part on detecting the first value of the second signal. In some examples, the storage component 535 may be configured as or otherwise support a means for storing, at a register associated with the second memory die, a second identifier of the second location of the second memory die based at least in part on detecting the second value of the third signal. In some examples, the storage component 535 may be configured as or otherwise support a means for storing the first identifier or the second identifier or both in a non-volatile read-only memory associated with the first memory die and the second memory die based at least in part on storing the first identifier in the register and the second identifier in the register.

In some examples, the comparison component 540 may be configured as or otherwise support a means for comparing the first identifier and the second identifier to one or more values of a non-volatile read-only memory associated with the first memory die and the second memory die.

In some examples, the command component 545 may be configured as or otherwise support a means for refraining from issuing a command to alter a value of the non-volatile read-only memory associated with the first memory die or the second memory die based at least in part on comparing the first identifier and the second identifier to the one or more values of the non-volatile read-only memory.

In some examples, the first circuit of the first memory die and the second circuit of the second memory die are coupled with a bond wire, and the signal inversion component 550 may be configured as or otherwise support a means for inverting, at the first circuit of the first memory die, the first value of the second signal to the second value in response to storing the first identifier of the first memory die, where the third signal includes the inverted second signal.

In some examples, the output component 555 may be configured as or otherwise support a means for outputting, from the first circuit of the first memory die, the first identifier based at least in part on receiving the first signal. In some examples, the output component 555 may be configured as or otherwise support a means for outputting, from the second circuit of the second memory die, the second identifier based at least in part on receiving the first signal.

In some examples, the output component 555 may be configured as or otherwise support a means for outputting, from the first circuit of the first memory die, a third identifier based at least in part on the first signal being disabled. In some examples, the output component 555 may be configured as or otherwise support a means for outputting, from the second circuit of the second memory die, a fourth identifier based at least in part on the first signal being disabled.

In some examples, to support storing the first identifier or the second identifier or both in the non-volatile read-only memory, the current application component 560 may be configured as or otherwise support a means for applying, to a fuse or anti-fuse, a current that satisfies a threshold and alters a resistance of the fuse or anti-fuse.

In some examples, the signal disabling component 565 may be configured as or otherwise support a means for disabling the first circuit and the second circuit. In some examples, the signal disabling component 565 may be configured as or otherwise support a means for disabling the first circuit of the first memory die and the second circuit of the second memory die, where the second signal including the second value is associated with one or more operations for the first memory die and the second memory die based at least in part on disabling the first circuit of the first memory die and the second circuit of the second memory die.

In some examples, the reading component 570 may be configured as or otherwise support a means for reading the non-volatile read-only memory associated with the second memory die based at least in part on receiving the access command.

In some examples, the accessing component 575 may be configured as or otherwise support a means for accessing the second memory die based at least in part on a value of the one or more bits of the access command and reading the non-volatile read-only memory associated with the second memory die.

In some examples, the non-volatile read-only memory includes an array of fuses or an array of anti-fuses. In some examples, the second circuit of the second memory die is coupled with a first voltage source. In some examples, the second circuit of the second memory die is configured to receive the third signal based at least in part on the first voltage source. In some examples, the first circuit of the first memory die is coupled with a second voltage source. In some examples, the first circuit of the first memory die is configured to receive the second signal based at least in part on the second voltage source.

In some examples, the first circuit and the second circuit are coupled with a ground node via a weak pull-down circuit. In some examples, the first identifier includes an indication that the first memory die is an interface die and the second identifier includes an indication that the second memory die is a linked die.

Figure 6:
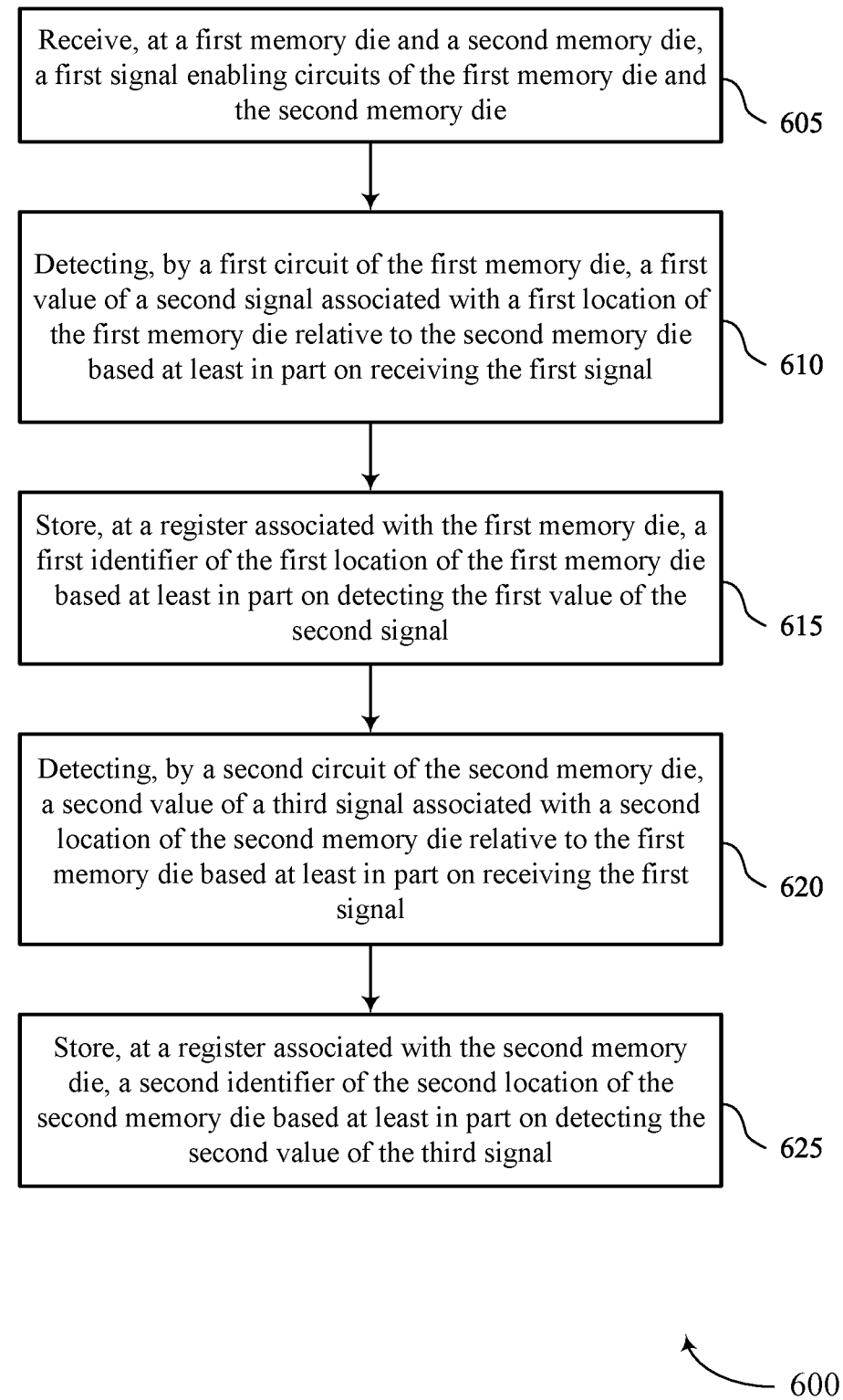
FIG. 6 shows a flowchart illustrating a method or methods that support die location detection for grouped memory dies in accordance with examples as disclosed herein.

FIG. 6 shows a flowchart illustrating a method 600 that supports die location detection for grouped memory dies in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally, or alternatively, the memory device may perform aspects of the described functions using special-purpose hardware.

At 605, the method may include receiving, at a first memory die and a second memory die, a first signal enabling circuits of the first memory die and the second memory die. The operations of 605 may be performed in accordance with examples as disclosed herein. In some examples, aspects of the operations of 605 may be performed by a signal reception component 525 as described with reference to FIG. 5.

At 610, the method may include detecting, by a first circuit of the first memory die, a first value of a second signal associated with a first location of the first memory die relative to the second memory die based at least in part on receiving the first signal. The operations of 610 may be performed in accordance with examples as disclosed herein. In some examples, aspects of the operations of 610 may be performed by a detection component 530 as described with reference to FIG. 5.

At 615, the method may include storing, at a register associated with the first memory die, a first identifier of the first location of the first memory die based at least in part on detecting the first value of the second signal. The operations of 615 may be performed in accordance with examples as disclosed herein. In some examples, aspects of the operations of 615 may be performed by a storage component 535 as described with reference to FIG. 5.

At 620, the method may include detecting, by a second circuit of the second memory die, a second value of a third signal associated with a second location of the second memory die relative to the first memory die based at least in part on receiving the first signal. The operations of 620 may be performed in accordance with examples as disclosed herein. In some examples, aspects of the operations of 620 may be performed by a detection component 530 as described with reference to FIG. 5.

At 625, the method may include storing, at a register associated with the second memory die, a second identifier of the second location of the second memory die based at least in part on detecting the second value of the third signal. The operations of 625 may be performed in accordance with examples as disclosed herein. In some examples, aspects of the operations of 625 may be performed by a storage component 535 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor) for receiving, at a first memory die and a second memory die, a first signal enabling circuits of the first memory die and the second memory die, detecting, by a first circuit of the first memory die, a first value of a second signal associated with a first location of the first memory die relative to the second memory die based at least in part on receiving the first signal, storing, at a register associated with the first memory die, a first identifier of the first location of the first memory die based at least in part on detecting the first value of the second signal, detecting, by a second circuit of the second memory die, a second value of a third signal associated with a second location of the second memory die relative to the first memory die based at least in part on receiving the first signal, and storing, at a register associated with the second memory die, a second identifier of the second location of the second memory die based at least in part on detecting the second value of the third signal.

Some examples of the method 600 and the apparatus described herein may further include operations, features, circuitry, logic, means, or instructions for storing the first identifier or the second identifier or both in a non-volatile read-only memory associated with the first memory die and the second memory die based at least in part on storing the first identifier in the register and the second identifier in the register.

In some examples of the method 600 and the apparatus described herein, the non-volatile read-only memory includes an array of fuses or an array of anti-fuses.

In some examples of the method 600 and the apparatus described herein, storing the first identifier or the second identifier or both in the non-volatile read-only memory may include operations, features, circuitry, logic, means, or instructions for applying, to a fuse or anti-fuse, a current that satisfies a threshold and alters a resistance of the fuse or anti-fuse.

Some examples of the method 600 and the apparatus described herein may further include operations, features, circuitry, logic, means, or instructions for disabling the first circuit and the second circuit, receiving, via a command/address channel coupled with the first memory die and the second memory die, an access command including one or more bits indicating to access the second memory die, reading the non-volatile read-only memory associated with the second memory die based at least in part on receiving the access command, and accessing the second memory die based at least in part on a value of the one or more bits of the access command and reading the non-volatile read-only memory associated with the second memory die.

Some examples of the method 600 and the apparatus described herein may further include operations, features, circuitry, logic, means, or instructions for comparing the first identifier and the second identifier to one or more values of a non-volatile read-only memory associated with the first memory die and the second memory die and refraining from issuing a command to alter a value of the non-volatile read-only memory associated with the first memory die or the second memory die based at least in part on comparing the first identifier and the second identifier to the one or more values of the non-volatile read-only memory.

In some examples of the method 600 and the apparatus described herein, the first circuit of the first memory die and the second circuit of the second memory die may be coupled with a bond wire and the method, apparatuses, and non-transitory computer-readable medium may include further operations, features, circuitry, logic, means, or instructions for inverting, at the first circuit of the first memory die, the first value of the second signal to the second value in response to storing the first identifier of the first memory die, where the third signal includes the inverted second signal.

Some examples of the method 600 and the apparatus described herein may further include operations, features, circuitry, logic, means, or instructions for disabling the first circuit of the first memory die and the second circuit of the second memory die, where the second signal including the second value may be associated with one or more operations for the first memory die and the second memory die based at least in part on disabling the first circuit of the first memory die and the second circuit of the second memory die.

Some examples of the method 600 and the apparatus described herein may further include operations, features, circuitry, logic, means, or instructions for outputting, from the first circuit of the first memory die, the first identifier based at least in part on receiving the first signal and outputting, from the second circuit of the second memory die, the second identifier based at least in part on receiving the first signal.

Some examples of the method 600 and the apparatus described herein may further include operations, features, circuitry, logic, means, or instructions for outputting, from the first circuit of the first memory die, a third identifier based at least in part on the first signal being disabled and outputting, from the second circuit of the second memory die, a fourth identifier based at least in part on the first signal being disabled.

In some examples of the method 600 and the apparatus described herein, the second circuit of the second memory die may be coupled with a first voltage source, and the second circuit of the second memory die may be configured to receive the third signal based at least in part on the first voltage source.

In some examples of the method 600 and the apparatus described herein, the first circuit of the first memory die may be coupled with a second voltage source, and the first circuit of the first memory die may be configured to receive the second signal based at least in part on the second voltage source.

In some examples of the method 600 and the apparatus described herein, the first circuit and the second circuit may be coupled with a ground node via a weak pull-down circuit.

In some examples of the method 600 and the apparatus described herein, the first identifier includes an indication that the first memory die may be an interface die and the second identifier includes an indication that the second memory die may be a linked die.

It should be noted that the methods described herein describe possible implementations, and that the operations and the steps may be rearranged or otherwise modified and that other implementations are possible. Further, portions from two or more of the methods may be combined.

An apparatus is described. The apparatus may include a command/address channel, a first memory die coupled with the command/address channel and including a first circuit configured to output a first identifier of the first memory die based at least in part on receiving a first signal to enable the first circuit and on detecting a first value of a second signal, a first register coupled with the first circuit and configured to store the first identifier of the first memory die based at least in part on the first circuit outputting the first identifier, a second memory die coupled with the command/address channel and including a second circuit configured to output a second identifier of the second memory die based at least in part on receiving the first signal to enable the second circuit and on detecting a second value of a third signal, and a second register coupled with the second circuit and configured to store the second identifier of the second memory die based at least in part on the second circuit outputting the second identifier.

In some examples of the apparatus, the first circuit includes a first pull-down circuit coupled with a first node of the first circuit and configured to adjust a value of the second signal, where the second signal includes the second value based at least in part on the first pull-down circuit adjusting the value of the second signal, a first latch coupled with the first node and configured to receive the second signal including the second value and output the first identifier based at least in part on the first pull-down circuit adjusting the value of the second signal, and an inverter coupled with the first node and configured to invert the second signal including the second value based at least in part on the first latch receiving the first signal.

In some examples of the apparatus, the first circuit includes a multiplexer including a first input coupled with the latch and a second input coupled with a non-volatile memory, the multiplexer configured to select an output of the first circuit from the first input or the second input based at least in part on a value of the first signal received by the multiplexer.

In some examples, the apparatus may include an array of fuses or anti-fuses coupled with the second input of the multiplexer and configured to store a value for the first identifier, where the non-volatile memory includes the array of fuses or anti-fuses.

In some examples of the apparatus, the second circuit includes a second pull-down circuit coupled with a second node of the first circuit and configured to adjust a value of the inverted second signal, where the third signal includes the inverted second signal and a second latch coupled with the second node and configured to receive the third signal and output the second identifier based at least in part on the second pull-down circuit adjusting the value of the inverted second signal.

In some examples of the apparatus, the first memory die may be coupled with the second memory die via a bond wire; and the bond wire may be coupled with an output of the inverter of the first circuit and the second node of the second circuit may be coupled with the bond wire.

In some examples, the apparatus may include enable the latch of the first circuit, cause a multiplexer of the first circuit to output a first input of the multiplexer or a second input of the multiplexer, and disable one or more other circuits coupled with the bond wire.

In some examples, the apparatus may include a first voltage source coupled with the second circuit of the second memory die, where the second circuit may be configured to receive the third signal based at least in part on being coupled with the first voltage source.

In some examples, the apparatus may include a second voltage source coupled with the first circuit of the first memory die, where the first circuit may be configured to receive the second signal including the second value based at least in part on being coupled with the second voltage source.

In some examples of the apparatus, the first memory die and the second memory die may be coupled with a host device and may be accessible by a peripheral device coupled with the host device via an interface configured for a Compute Express Link (CXL) protocol and the first memory die and the second memory die may be coupled with the peripheral device and may be accessible by the host device via the interface.

In some examples of the apparatus, the first identifier includes an indication that the first memory die may be an interface die, and the second identifier includes an indication that the second memory die may be a linked die.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. If a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a command/address channel;
   a first memory die coupled with the command/address channel and comprising a first circuit configured to output a first identifier of the first memory die based at least in part on receiving a first signal to enable the first circuit and on detecting a first value of a second signal;
   a first register coupled with the first circuit and configured to store the first identifier of the first memory die based at least in part on the first circuit outputting the first identifier;
   a second memory die coupled with the command/address channel and comprising a second circuit configured to output a second identifier of the second memory die based at least in part on receiving the first signal to enable the second circuit and on detecting a second value of a third signal; and a second register coupled with the second circuit and configured to store the second identifier of the second memory die based at least in part on the second circuit outputting the second identifier.

2. The apparatus of claim 1, wherein the first circuit comprises:
a first pull-down circuit coupled with a first node of the first circuit and configured to adjust a value of the second signal, wherein the second signal comprises the second value based at least in part on the first pull-down circuit adjusting the value of the second signal;
a first latch coupled with the first node and configured to receive the second signal comprising the second value and output the first identifier based at least in part on the first pull-down circuit adjusting the value of the second signal; and
an inverter coupled with the first node and configured to invert the second signal comprising the second value based at least in part on the first latch receiving the first signal.

3. The apparatus of claim 2, wherein the first circuit comprises:
a multiplexer comprising a first input coupled with the first latch and a second input coupled with a non-volatile memory, the multiplexer configured to select an output of the first circuit from the first input or the second input based at least in part on a value of the first signal received by the multiplexer.

4. The apparatus of claim 3, further comprising:
an array of fuses or anti-fuses coupled with the second input of the multiplexer and configured to store a value for the first identifier, wherein the non-volatile memory comprises the array of fuses or anti-fuses.

5. The apparatus of claim 2, wherein the second circuit comprises:
a second pull-down circuit coupled with a second node of the first circuit and configured to adjust a value of the inverted second signal, wherein the third signal comprises the inverted second signal; and
a second latch coupled with the second node and configured to receive the third signal and output the second identifier based at least in part on the second pull-down circuit adjusting the value of the inverted second signal.

6. The apparatus of claim 5, wherein:
the first memory die is coupled with the second memory die via a bond wire; and
the bond wire is coupled with an output of the inverter of the first circuit and the second node of the second circuit is coupled with the bond wire.

7. The apparatus of claim 6, wherein the first signal is configured to:
enable the first latch of the first circuit;
cause a multiplexer of the first circuit to output a first input of the multiplexer or a second input of the multiplexer; and
disable one or more other circuits coupled with the bond wire.

8. The apparatus of claim 1, further comprising:
a first voltage source coupled with the second circuit of the second memory die, wherein the second circuit is configured to receive the third signal based at least in part on being coupled with the first voltage source.

9. The apparatus of claim 8, further comprising:
a second voltage source coupled with the first circuit of the first memory die, wherein the first circuit is configured to receive the second signal comprising the second value based at least in part on being coupled with the second voltage source.

10. The apparatus of claim 1, wherein:
the first memory die and the second memory die are coupled with a host device and are accessible by a peripheral device coupled with the host device via an interface configured for a Compute Express Link (CXL) protocol; or
the first memory die and the second memory die are coupled with the peripheral device and are accessible by the host device via the interface.

11. The apparatus of claim 1, wherein:
the first identifier comprises an indication that the first memory die is an interface die, and
the second identifier comprises an indication that the second memory die is a linked die.

12. A method, comprising:
receiving, at a first memory die and a second memory die, a first signal enabling circuits of the first memory die and the second memory die;
detecting, by a first circuit of the first memory die, a first value of a second signal associated with a first location of the first memory die relative to the second memory die based at least in part on receiving the first signal;
storing, at a register associated with the first memory die, a first identifier of the first location of the first memory die based at least in part on detecting the first value of the second signal;
detecting, by a second circuit of the second memory die, a second value of a third signal associated with a second location of the second memory die relative to the first memory die based at least in part on receiving the first signal; and
storing, at a register associated with the second memory die, a second identifier of the second location of the second memory die based at least in part on detecting the second value of the third signal.

13. The method of claim 12, further comprising:
storing the first identifier or the second identifier or both in a non-volatile read-only memory associated with the first memory die and the second memory die based at least in part on storing the first identifier in the register and the second identifier in the register.

14. The method of claim 13, wherein the non-volatile read-only memory comprises an array of fuses or an array of anti-fuses.

15. The method of claim 13, wherein storing the first identifier or the second identifier or both in the non-volatile read-only memory comprises:
applying, to a fuse or anti-fuse, a current that satisfies a threshold and alters a resistance of the fuse or anti-fuse.

16. The method of claim 13, further comprising:
disabling the first circuit and the second circuit;
receiving, via a command/address channel coupled with the first memory die and the second memory die, an access command comprising one or more bits indicating to access the second memory die;
reading the non-volatile read-only memory associated with the second memory die based at least in part on receiving the access command; and
accessing the second memory die based at least in part on a value of the one or more bits of the access command and reading the non-volatile read-only memory associated with the second memory die.

17. The method of claim 12, further comprising:
comparing the first identifier and the second identifier to one or more values of a non-volatile read-only memory associated with the first memory die and the second memory die; and
refraining from issuing a command to alter a value of the non-volatile read-only memory associated with the first memory die or the second memory die based at least in part on comparing the first identifier and the second identifier to the one or more values of the non-volatile read-only memory.

18. The method of claim 12, wherein the first circuit of the first memory die and the second circuit of the second memory die are coupled with a bond wire, the method further comprising:
inverting, at the first circuit of the first memory die, the first value of the second signal to the second value in response to storing the first identifier of the first memory die, wherein the third signal comprises the inverted second signal.

19. The method of claim 18, further comprising:
disabling the first circuit of the first memory die and the second circuit of the second memory die, wherein the second signal comprising the second value is associated with one or more operations for the first memory die and the second memory die based at least in part on disabling the first circuit of the first memory die and the second circuit of the second memory die.

20. The method of claim 12, further comprising:
outputting, from the first circuit of the first memory die, the first identifier based at least in part on receiving the first signal; and
outputting, from the second circuit of the second memory die, the second identifier based at least in part on receiving the first signal.

21. The method of claim 20, further comprising:
outputting, from the first circuit of the first memory die, a third identifier based at least in part on the first signal being disabled; and
outputting, from the second circuit of the second memory die, a fourth identifier based at least in part on the first signal being disabled.

22. The method of claim 12, wherein:
the second circuit of the second memory die is coupled with a first voltage source,
the second circuit of the second memory die is configured to receive the third signal based at least in part on the first voltage source.

23. The method of claim 22, wherein:
the first circuit of the first memory die is coupled with a second voltage source,
the first circuit of the first memory die is configured to receive the second signal based at least in part on the second voltage source.

24. The method of claim 12, wherein the first circuit and the second circuit are coupled with a ground node via a weak pull-down circuit.

25. The method of claim 12, wherein the first identifier comprises an indication that the first memory die is an interface die and the second identifier comprises an indication that the second memory die is a linked die.

26. An apparatus, comprising:
a first memory die coupled with a command/address channel and comprising a first circuit;
a second memory die coupled with the command/address channel and comprising a second circuit;
a register coupled with the first circuit and the second circuit; and
a controller coupled with the first memory die and the second memory die, wherein the controller is configured to cause the apparatus to:
receive, at the first memory die and the second memory die, a first signal to enable the first circuit and the second circuit;
detect, by the first circuit of the first memory die, a first value of a second signal associated with a first location of the first memory die relative to the second memory die based at least in part on receiving the first signal;
store, at the register, a first identifier of the first location of the first memory die based at least in part on detecting the first value of the second signal;
detect, by the second circuit of the second memory die, a second value of a third signal associated with a second location of the second memory die relative to the first memory die based at least in part on receiving the first signal; and
store, at the register, a second identifier of the second location of the second memory die based at least in part on detecting the second value of the third signal.

27. The apparatus of claim 26, wherein the controller is configured to cause the apparatus to:
store the first identifier or the second identifier or both in a non-volatile read-only memory associated with the first memory die and the second memory die based at least in part on storing the first identifier in the register and the second identifier in the register.

28. The apparatus of claim 27, wherein the non-volatile read-only memory comprises an array of fuses or an array of anti-fuses.

29. The apparatus of claim 27, wherein, to store the first identifier or the second identifier or both in the non-volatile read-only memory, the controller is operable to cause the apparatus to:
apply, to a fuse or anti-fuse, a current that satisfies a threshold and alters a resistance of the fuse or anti-fuse.

30. The apparatus of claim 27, wherein the controller is configured to cause the apparatus to:
disable the first circuit and the second circuit;
receive, via the command/address channel, an access command comprising one or more bits indicating to access the second memory die;
read the non-volatile read-only memory associated with the second memory die based at least in part on receiving the access command; and
access the second memory die based at least in part on a value of the one or more bits of the access command and reading the non-volatile read-only memory associated with the second memory die.

31. The apparatus of claim 26, wherein the controller is configured to cause the apparatus to:
compare the first identifier and the second identifier to one or more values of a non-volatile read-only memory associated with the first memory die and the second memory die; and
refrain from issuing a command to alter a value of the non-volatile read-only memory associated with the first memory die or the second memory die based at least in part on comparing the first identifier and the second identifier to the one or more values of the non-volatile read-only memory.

32. The apparatus of claim 26, wherein the first circuit of the first memory die and the second circuit of the second memory die are coupled with a bond wire, and wherein the controller is configured to cause the apparatus to:
- invert, at the first circuit of the first memory die, the first value of the second signal to the second value in response to storing the first identifier of the first memory die, wherein the third signal comprises the inverted second signal.

33. The apparatus of claim 32, wherein the controller is configured to cause the apparatus to:
- disable the first circuit of the first memory die and the second circuit of the second memory die, wherein the second signal comprising the second value is associated with one or more operations for the first memory die and the second memory die based at least in part on disabling the first circuit of the first memory die and the second circuit of the second memory die.

34. An apparatus, comprising:
- means for receiving, at a first memory die and a second memory die, a first signal to enable circuits of the first memory die and the second memory die;
- means for detecting, by a first circuit of the first memory die, a first value of a second signal associated with a first location of the first memory die relative to the second memory die based at least in part on receiving the first signal;
- means for storing, at a register associated with the first memory die, a first identifier of the first location of the first memory die based at least in part on detecting the first value of the second signal;
- means for detecting, by a second circuit of the second memory die, a second value of a third signal associated with a second location of the second memory die relative to the first memory die based at least in part on receiving the first signal; and
- means for storing, at a register associated with the second memory die, a second identifier of the second location of the second memory die based at least in part on detecting the second value of the third signal.

35. A non-transitory computer-readable medium storing code comprising instructions which, when executed by a processor of an electronic device, cause the electronic device to:
- receive, at a first memory die and a second memory die, a first signal to enable circuits of the first memory die and the second memory die;
- detect, by a first circuit of the first memory die, a first value of a second signal associated with a first location of the first memory die relative to the second memory die based at least in part on receiving the first signal;
- store, at a register associated with the first memory die, a first identifier of the first location of the first memory die based at least in part on detecting the first value of the second signal;
- detect, by a second circuit of the second memory die, a second value of a third signal associated with a second location of the second memory die relative to the first memory die based at least in part on receiving the first signal; and
- store, at a register associated with the second memory die, a second identifier of the second location of the second memory die based at least in part on detecting the second value of the third signal.

* * * * *